United States Patent
Ralph et al.

(10) Patent No.: US 6,407,327 B1
(45) Date of Patent: *Jun. 18, 2002

(54) MODULAR, GLASS COVERED SOLAR CELL ARRAY

(75) Inventors: Eugene Ralph, San Gabriel; Ellen B. Linder, Whittier; James P. Hanley; Mark DeWitt, both of Simi Valley; James R. Walle, Moorpark; Norman L. Beze, Simi Valley, all of CA (US)

(73) Assignee: Tecstar Power Systems, Inc., City of Industry, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/547,687

(22) Filed: Apr. 12, 2000

Related U.S. Application Data

(63) Continuation of application No. 09/090,663, filed on Jun. 4, 1998, now Pat. No. 6,156,967.

(51) Int. Cl.[7] ......................... H01L 31/042; H01L 31/05
(52) U.S. Cl. ......................... 136/244; 136/292; 136/256
(58) Field of Search ................... 136/244, 251, 136/256, 259, 249, 292, 261, 262, 255

(56) References Cited

U.S. PATENT DOCUMENTS

| | | | |
|---|---|---|---|
| 3,489,615 A | * 1/1970 | Mann et al. ............. | 136/89 |
| 3,887,935 A | 6/1975 | Fischer et al. ........... | 357/15 |
| 3,899,689 A | 8/1975 | Baker ..................... | 307/117 |
| 3,912,539 A | * 10/1975 | Magee .................... | 136/89 |
| 3,956,765 A | 5/1976 | Fischer et al. ........... | 357/30 |
| 4,195,621 A | 4/1980 | Firebaugh ............... | 126/416 |
| 4,281,278 A | 7/1981 | Bilsky et al. ............ | 320/13 |
| 4,322,571 A | * 3/1982 | Stanbery ................. | 136/255 |
| 4,323,719 A | 4/1982 | Green .................... | 136/249 |
| 4,361,950 A | * 12/1982 | Amick .................... | 29/572 |
| 4,367,365 A | 1/1983 | Spencer .................. | 136/244 |
| 4,481,378 A | 11/1984 | Lesk ...................... | 136/244 |
| 4,567,316 A | 1/1986 | Hollaus et al. ........... | 136/246 |

(List continued on next page.)

*Primary Examiner*—Harold Pyon
*Assistant Examiner*—Michael C. Miggins
(74) *Attorney, Agent, or Firm*—Knobbe, Martens, Olson & Bear, LLP

(57) ABSTRACT

A radiation tolerant solar cell array module which can be efficiently assembled into a larger solar panel to generate power for a spacecraft the module includes at least first and second single-crystal solar cells. The first and second solar cells have front sides and back sides. At least one of the solar cells has a shallow junction N on P structure. A first contact is formed on at least the back side of the first solar cell. A second contact formed on at least the back side of the second solar cell. A conductor is in electrical communication with the first contact and the second contact. A substantially transparent ceria-doped cover overlays at least a portion of each of the solar cells. The cover remains substantially transparent when exposed to an AM0 space radiation environment. A substantially transparent adhesive is situated between the cover and the solar cell portions. The adhesive remains substantially transparent when exposed to a space radiation environment.

21 Claims, 14 Drawing Sheets

U.S. PATENT DOCUMENTS

| | | | |
|---|---|---|---|
| 4,577,051 A | | 3/1986 | Hartman .................... 136/244 |
| 4,610,077 A | * | 9/1986 | Minahan et al. .............. 29/572 |
| 4,612,408 A | | 9/1986 | Moddel et al. ............. 136/244 |
| 4,759,803 A | | 7/1988 | Cohen ........................ 136/244 |
| 4,771,017 A | | 9/1988 | Tobin et al. ................ 437/203 |
| 4,776,893 A | | 10/1988 | McLeod et al. ............ 136/249 |
| 4,909,856 A | * | 3/1990 | Ralph ........................ 136/256 |
| 4,933,022 A | | 6/1990 | Swanson ................... 136/249 |
| 4,999,524 A | | 3/1991 | Williams et al. ............ 428/251 |
| 5,009,720 A | | 4/1991 | Hokuyo et al. ............ 136/255 |
| 5,011,544 A | * | 4/1991 | Gaddy et al. ............... 136/246 |
| 5,043,024 A | | 8/1991 | Cammerer et al. ......... 136/244 |
| 5,131,341 A | | 7/1992 | Newman ................... 114/39.1 |
| 5,138,403 A | | 8/1992 | Spitzer ........................ 357/15 |
| 5,230,746 A | | 7/1993 | Wiedeman et al. ......... 136/249 |
| 5,248,346 A | | 9/1993 | Fraas et al. ................. 136/244 |
| 5,330,583 A | | 7/1994 | Asai et al. ................... 136/251 |
| 5,330,584 A | | 7/1994 | Saga et al. .................. 136/255 |
| 5,342,453 A | * | 8/1994 | Olson ......................... 136/262 |
| 5,389,158 A | | 2/1995 | Fraas et al. .................. 136/244 |
| 5,391,235 A | | 2/1995 | Inoue ......................... 136/244 |
| 5,449,413 A | | 9/1995 | Beauchamp et al. ........ 136/257 |
| 5,498,297 A | | 3/1996 | O'Neill et al. .............. 136/246 |
| 5,514,223 A | | 5/1996 | Vogeli ........................ 136/244 |
| 5,542,988 A | * | 8/1996 | Bogus ........................ 136/244 |
| 5,567,248 A | * | 10/1996 | Chung ........................ 136/244 |
| 5,616,185 A | | 4/1997 | Kukulka ..................... 136/244 |
| 5,650,019 A | | 7/1997 | Yamada et al. ............. 136/251 |
| 5,684,385 A | | 11/1997 | Guyonneau et al. .......... 320/15 |
| 5,741,370 A | * | 4/1998 | Hanoka ..................... 136/251 |
| 5,753,319 A | * | 5/1998 | Knapp et al. ............... 427/529 |
| 5,895,719 A | * | 4/1999 | Fyles et al. ................. 428/220 |

\* cited by examiner

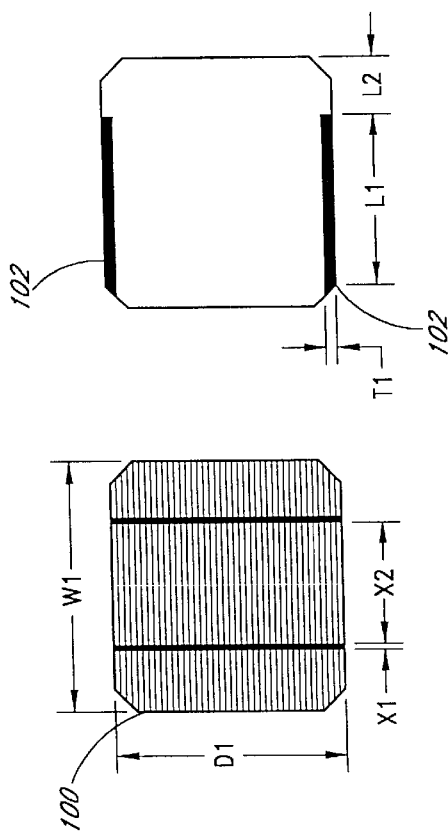
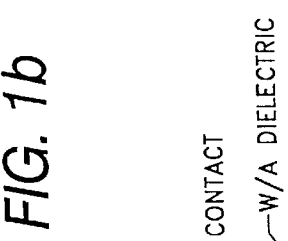
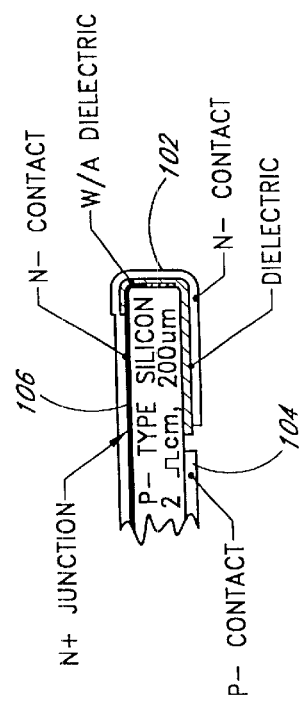
FIG. 1a
FIG. 1b
FIG. 1c

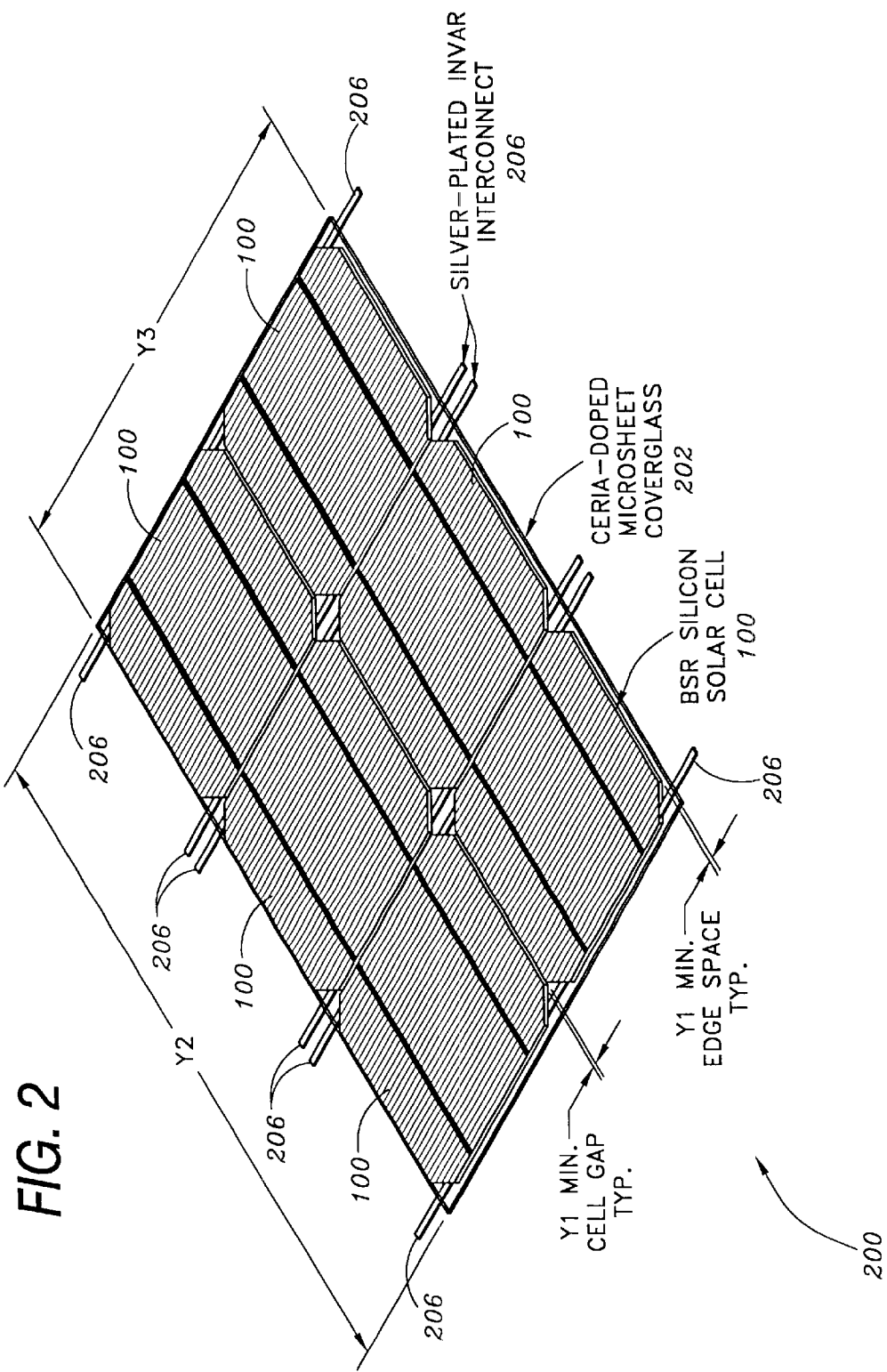

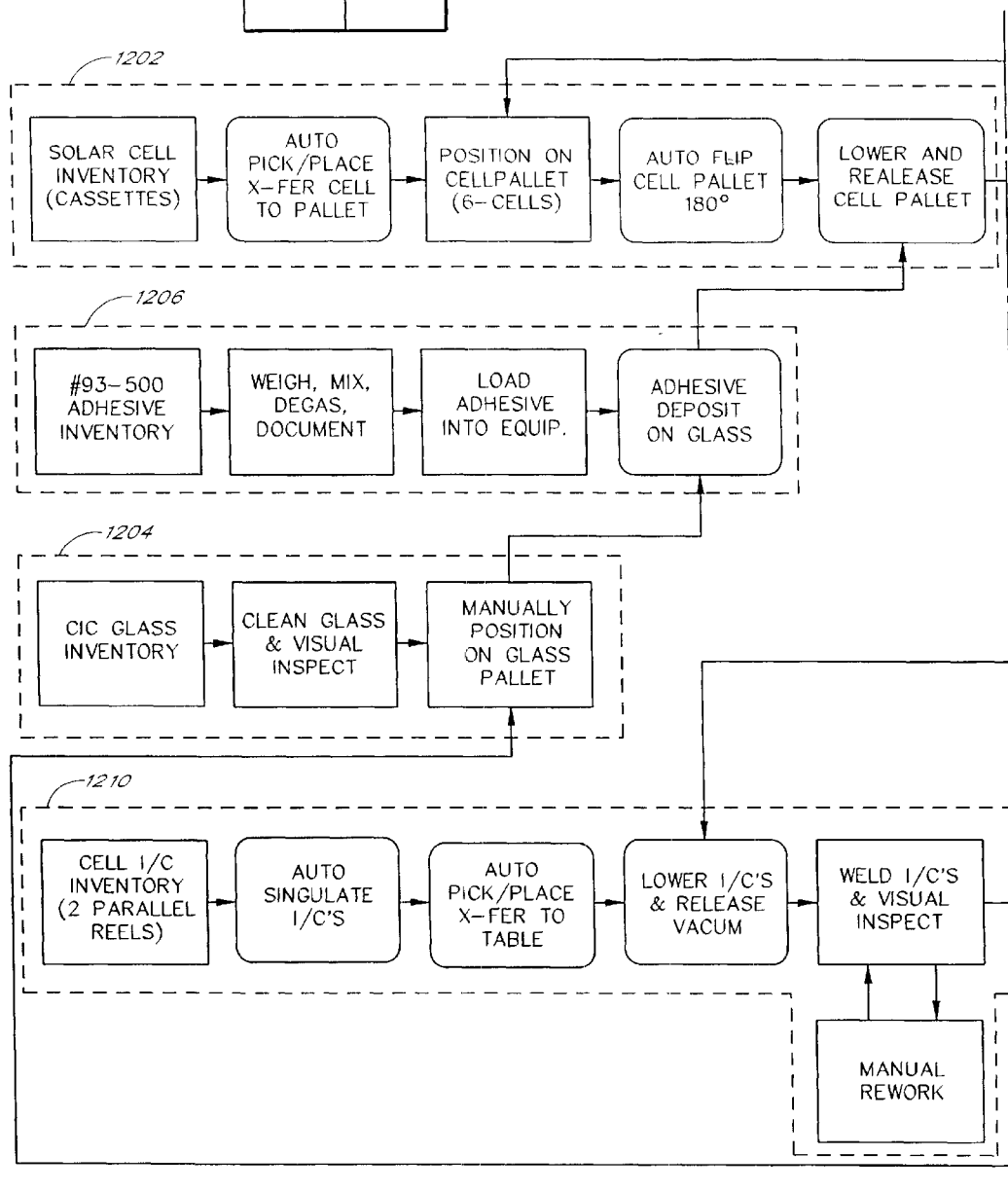

US 6,407,327 B1

MODULAR, GLASS COVERED SOLAR CELL ARRAY

This application is a continuation of application Ser. No. 09/090,663 filed Jun. 4, 1998, now U.S. Pat. No. 6,156,967.

BACKGROUND OF THE INVENTION

1. Field of the Invention

The present invention relates to solar cells. In particular, the invention relates to methods and apparatuses for efficient packaging of solar cells for space applications.

2. Description of the Related Art

Photovoltaic cells, commonly called solar cells, are well-known devices which convert solar energy into electrical energy. Solar cells have long been used to generate electrical power in both terrestrial and space applications. Solar cells offer several advantages over more conventional power sources. For example, solar cells offer a clean method for generating electricity. Furthermore, solar cells do not have to be replenished with fossil fuels. Instead, solar cells are powered by the virtually limitless energy of the sun. However, the use of solar cells has been limited because solar cells are a relatively expensive method of generating electricity. Nonetheless, the solar cell is an attractive device for generating energy in space, where low-cost conventional power sources are unavailable.

Typically, solar cells manufactured for space use have been of fairly small dimensions. Commonly, solar cells have had dimensions of 4 cm×6 cm or less. In space applications, hundreds or thousands of the small solar cells are interconnected together to form large solar arrays. In a typical manufacturing process, a solar cell manufacturer delivers hundreds or thousands of separate, unconnected, solar cells to a solar array assembler. Often, the solar cell manufacturer mounts a coverglass over each cell to protect the cells against space radiation and other environmental conditions. Alternatively, the solar cell manufacturer may ship bare cells to the array assembler. The array assembler then must provide the coverglass. The array assembler also interconnects the individual cells into large, suitably sized panels.

The use of individual coverglasses for each cell has several disadvantages. For example, it is expensive and time consuming to mount a separate coverglass on each cell. In addition, the use of small cells incurs several disadvantages. For example, the smaller the cell size, the more cells are required to form an array of a given size. The more cells which must be assembled, the greater the manufacturing costs. In addition, each cell must be tested individually before being assembled into a larger array. Thus, the greater the number of cells required, the greater the number of tests which must be performed. Furthermore, the smaller the cells, the greater the total cell edge length (i.e. the length of all cell sides summed together) for a given array size. Cell edges are typically prone to damage. Thus, the greater the total edge length, the more likely that at least some cells will be damaged during the manufacturing, transport, and assembly of the cells.

SUMMARY OF THE INVENTION

One preferred embodiment of the present invention is a modular, glass covered solar cell array suitable for use in space. The modular, glass covered solar cell array includes at least physically and electrically interconnected solar cells. At least a portion of both cells are covered by a common, substantially transparent cover. The transparency of the cover will not substantially degrade when exposed to a space radiation environment. In one embodiment, at least one cell is comprised of single-crystal silicon. In another embodiment, at least one cell is comprised of GaAs. In yet another embodiment, at least one cell is comprised of multijunctions.

In one embodiment of the present invention, at least one cell has an area of at least 100 $cm^2$. In another embodiment, at least-one cell is at least 150 $\mu$m thick. In still another preferred embodiment, at least one cell is thinner than 150 $\mu$m.

In another embodiment of the present invention, the solar array cells are interconnected by at least one conductor mounted on the backs of the cells. In still another embodiment, at least one cell has at least one contact for receiving the conductor. The contact wraps from a first side of the cell to a second side of the cell. In another embodiment, at least one cell has at least one contact for interconnection to at least one other solar cell array.

In one embodiment, the solar cell array includes at least one bypass diode mounted to at least one surface of one of the cells. In another embodiment, the solar cell array includes contacts for connection to at least one externally mounted bypass diode.

BRIEF DESCRIPTION OF THE DRAWINGS

These and other aspects, advantages, and novel features of the invention will become apparent upon reading the following detailed description and upon reference to accompanying drawings in which:

FIG. 1a illustrates one embodiment of a solar cell front side;

FIG. 1b illustrates one embodiment of a solar cell back side;

FIG. 1c illustrates one embodiment of a solar cell having wrap around contacts;

FIG. 2 illustrates one embodiment of a standard power module;

DETAILED DESCRIPTION OF THE PREFERRED EMBODIMENTS

Figure 3:
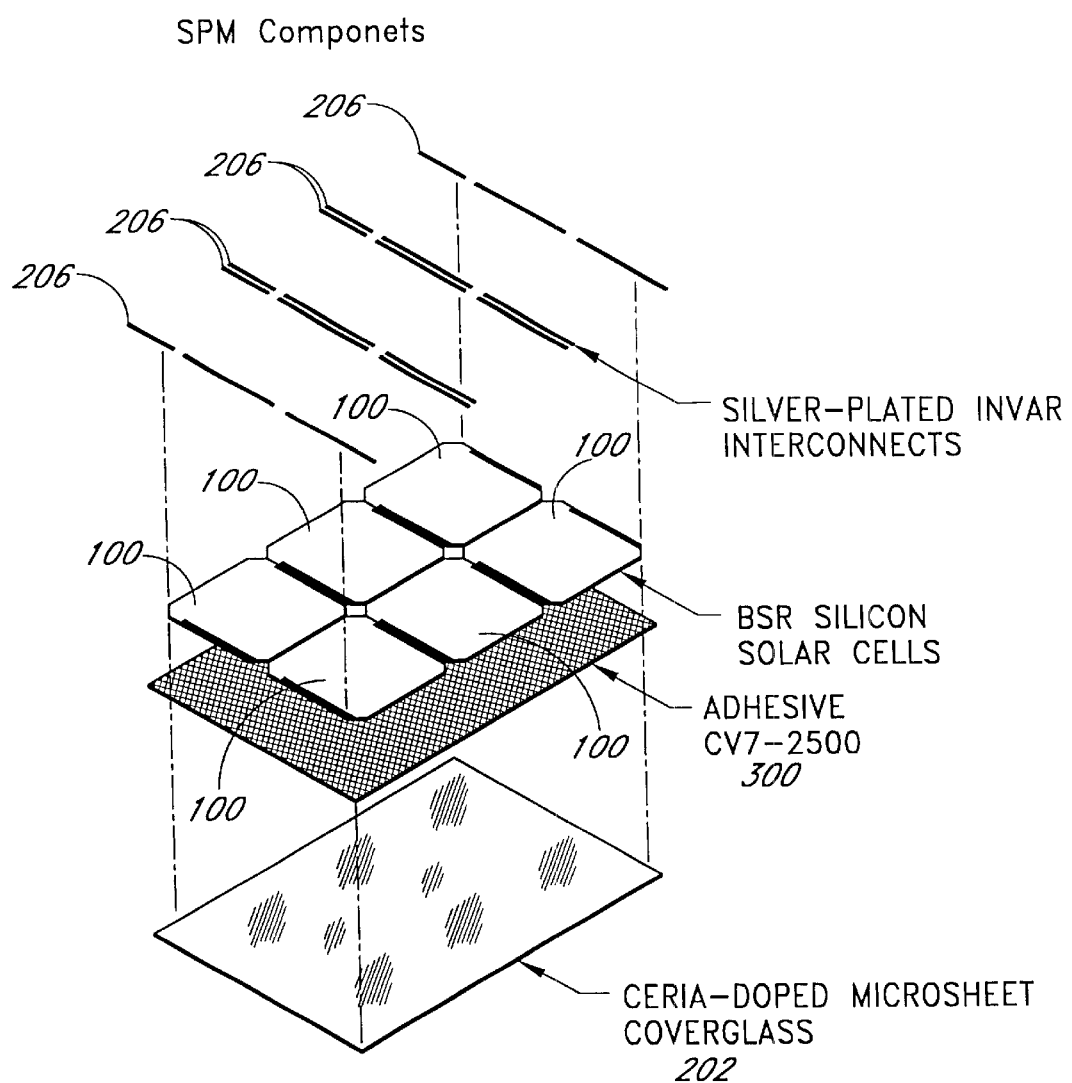
FIG. 3 illustrates components of one embodiment of the standard power module.

As illustrated in FIGS. 2 and 3, in one preferred embodiment a baseline modular, glass covered solar array 200, which is interchangeably called a standard power module (SPM), consists of a solar cell circuit matrix that can be readily used to build up a variety of array sizes. In a preferred embodiment, the SPM configuration consists of:

A large area (~20 cm×30 cm) ceria doped borosilicate coverglass microsheet 202, nominally 100 μm thick, which provides radiation resistant shielding for charged and uncharged particles. One skilled in the art will understand that other suitable coverglass materials and dimensions can be used as well.

Six large area (10 cm×10 cm) silicon solar cells 100, are approximately 200 μm thick. A preferred embodiment of a solar cell is illustrated in greater detail in FIGS. 1a–1c. The solar cells each have at least one space qualified N/P wraparound contact 102, although other configurations may be used as well. In a preferred embodiment, each solar cell has two contacts 102, 104, one for each cell doping polarity.

Two silver-plated Invar ribbon interconnectors 206, are approximately 50 μm thick, and may be, welded to each solar cell 100 to provide space qualified thermally matched series connection. One skilled in the art will understand that other interconnect technologies, such as mechanically bonding, crimping and soldering may also be used.

As illustrated in FIG. 3, transparent silicone adhesive 300, nominally 50 μm thick, bonds the solar cell circuit to the coverglass 202 and provides a space qualified non-darkening resilient interface.

In one preferred embodiment, the solar cell design is space qualified with a single-crystal silicon design. However, one skilled in the art will understand that other technologies, including GaAs/Ge and multijunction solar cells, can be used as well. In the preferred embodiment, the materials and the cell are optimized for performance in an AM0 spectrum (the spectrum found at Earth's orbit around the sun, outside of Earth's atmosphere) and the space radiation environment. As illustrated in FIG. 1c, a shallow junction N on P structure 106 which provides satisfactory radiation resistance may be used. By contrast, terrestrial silicon cells have lower radiation resistance because they use deep junctions to prevent punch through of the screen printed contacts. For extraterrestrial applications, the preferred base. silicon material is space qualified, Czochralski grown, boron doped, single-crystal silicon with a base resistivity of 1–3 ohm-cm. This resistivity is a compromise (radiation resistance vs. initial power) for many missions that don't see radiation fluences greater than about 3E15 e/cm$^2$ (1 MeV equivalent) where 10 ohm-cm material becomes advantageous. The silicon wafer of the preferred embodiment has been designed. to provide cost reductions compared to conventional designs, while at the same time maintaining those attributes that are important for maintaining radiation resistance, such as the resistivity and minority carrier lifetime.

As discussed above, GaAs/Ge and multijunction solar cells may be used in the SPM instead of silicon solar cells. The GaAs/Ge and multijunction solar cells, such as those manufactured by TECSTAR, can provide efficiencies greater than 24%.

From a reliability standpoint, an important design concern for solar cells is the contact characteristics. Preferably, both electrical and mechanical integrity are maintained throughout the mission even after many thermal stress cycles. To aid reliability, TiPdAg and AlTiPdAg back surface reflector (BSR) evaporated contacts may be used on silicon-type cells. To reduce costs, a metal shadow mask may be used, rather than much more expensive photolithographic techniques which can be used as well. A workable combination, consisting of bimetallic masks with narrow slots may be used. Mechanical fixturing with permanent magnets may be used to hold the masks firmly against the cell surface during metal evaporation.

In the preferred embodiment, the AlTiPdAg contact on the back, side of the solar cell has an evaporated aluminum BSR layer under the TiPdAg contact to reflect the long wavelength light which consequently reduces the absorptivity ($\alpha$) to 0.71.

In a preferred embodiment, a two sided wraparound (WA) contact configuration 102 as shown in FIGS. 1a–1c is used due to its many advantages. First, the contact "pick-off" at two opposite ends, halves the parasitic series resistance losses associated with 10 cm dimensions. Also, because the contacts 102, 104 are located primarily on the back of the cell 100, the front contact area is reduced, resulting in an increased active area. With all the terminal contacts 102, 104 on the back surface, the coverglass can cover the entire front surface, without introducing stress risers, resulting from top-to-bottom interconnects. The coverglass also provides full cell protection from atomic oxygen and high energy particle radiation effects. In the preferred embodiment, the design provides a "give away area" on the rear surface below 5%, adding less than 1% to the resistive losses.

As illustrated in FIGS. 1a–1c, in a preferred embodiment, the contact 102 is electrically coupled to N– material, while the contact 104 is electrically coupled to P+ material.

One embodiment of the front of the cell 100 illustrated in FIG. 1a has a dimension D1 of approximately 10 cm, a dimension W1 of approximately 10 cm, a bus bar width dimension X1 of approximately 0.1 cm, and a bus bar spacing of approximately 4.57 cm. One embodiment of the back of the cell 100 illustrated in FIG. 1b has a contact width dimension T1 of approximately 0.2175 cm, and an N channel contact length dimension L1 of approximately 6.55 cm, and a P channel contact length L2 of approximately 2.29 cm.

The estimated conversion efficiency of one embodiment of a 10 cm×10 cm, WA contact cell 100, is approximately 12.1% (1,367 W/m$^2$, AM0). This estimate is based on data from a prior art 13.7% efficient 4 cm×6 cm cells with dual antireflection coating derated by the following factors:

0.969 to include the effects of large cell area, series resistance and contact area losses;

0.945 to allow for the use of a single low cost layer CVD AR-coating;

0.980 for reduced area (obscuration), resulting from the use of low cost shadow masks;

0.985 for the WA contact effects, series losses from the give-way area, and shunt losses at the WA edges.

Typically, having fewer, larger cells reduces cost since the use of larger cells means there are less parts to handle, less testing, less waste area and consequently less attrition. Thus, the use of 10 cm×10 cm cells, such as are,used in terrestrial applications, as compared with 4 cm×6 cm or 8 cm×8 cm typically used in space applications, are used. This size is also compatible with the size ingots and the mechanization equipment available.

To minimize weight, the solar cell should preferably be as thin as practical, and 62 μm silicon cells have been fabricated and used to make flight qualified arrays, and may be used in the present invention. However, without incorporating a costly back surface field (BSF) design, there is a significant power loss for cells thinner than 150 μm. Thus, in one embodiment, a 200 μm cell thickness is used to minimize breakage losses associated with large area cells and to increase delta efficiency by 6%. This performance versus weight trade-offs is discussed further in the SPM discussion below.

In one embodiment, the solar cell antireflection coating is a single layer TiOx chemical vapor deposition (CVD) coating instead of the more expensive evaporated dual AR coatings. Both coating types can be used, have been space qualified, and have space flight heritage. However, in recent years, the additional Isc (short circuit current) performance advantage has been desired in spite of the additional costs and expensive evaporator equipment encountered. In order to reduce cost and increase throughput levels, the CVD method to form the AR coating in used in one embodiment. This coating will not delaminate or degrade the cell's mechanical integrity or electrical performance when operated over the specification environment and mission life.

Under dark reverse testing to 110% of Isc for 20 minutes, typical WA contact cells measured reverse voltages of 18–20 Volts. The use of bypass diode protection against reverse voltages is discussed below.

Figure 4:
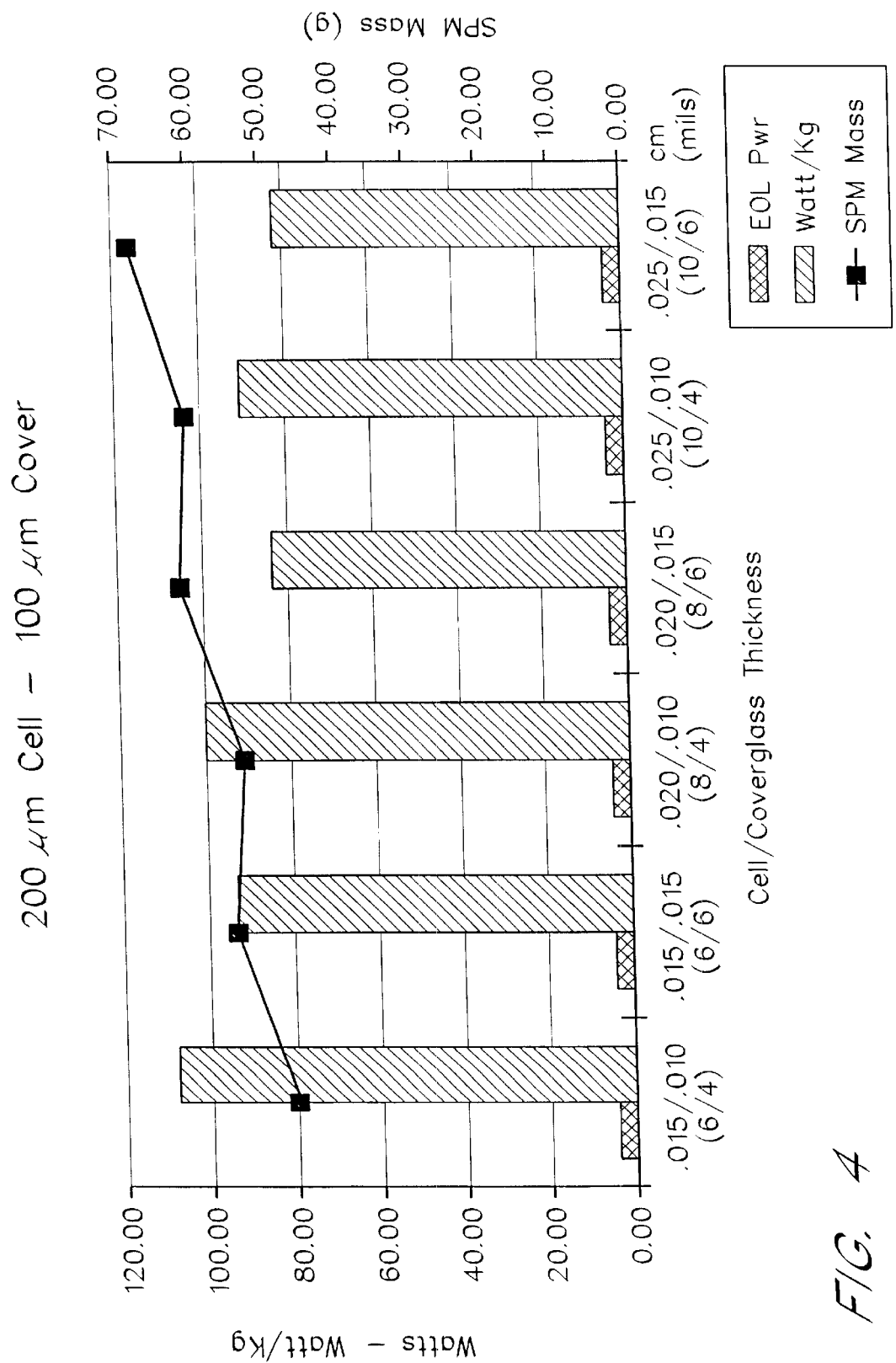
FIG. 4 illustrates the results of a power density tradeoff analysis.

A summary of the selected solar cell physical and performance characteristics is presented in Table 1. These characteristics were used to predict on-orbit performance for the mission life.

system trade studies that evaluated electrical and mechanical performance, mass, reliability, manufacturability, size, cost, schedule and heritage. The preferred embodiment of the baseline SPM design advantageously has the following properties:

Reduction in piece parts—higher reliability and lower cost;

Low mass—minimal coverglass adhesive, cell and coverglass mass, as illustrated in FIG. 4;

Manufacturable, efficient design—all interconnections are made on the back side of the SPM 200, as illustrated in FIG. 3; However, in other embodiments, the interconnections can be made on other SPM surfaces.

Space qualified components

Performance parameters are well characterized.

In one embodiment of the SPM 200 illustrated in FIG. 2, the SPM 200 has a length Y2 of approximately 30.17 cm, a width Y3 of approximately 20.135 cm, and a typical cell gap and edge spacing Y1 of approximately 0.025 cm.

The cell and coverglass trades for the SPM 200 are illustrated in FIG. 4 which shows an approximate power to mass ratio of 100 Watts/kg at End of Life (EOL) for the 0.020 cm/0.010 cm cell/coverglass thickness combination.

TABLE 1

The Solar Cell Outputs 1.62 Watts BOL
(12.1% Efficiency) In Production Quantity

|  | Type | Resistivity (ohm-cm) | Size (cm) | Weight (gm) | Weld Pull Strength (gm) |
|---|---|---|---|---|---|
| Physical Characteristics | Silicon N/P, BSR | 1–3 | 10 × 10 × 0.02 | 5.20 | ≧300 |

|  | Front Contacts | Back Contacts | AR-Coating | Solar Absorptance | Emittance (+cover) |
|---|---|---|---|---|---|
| Physical Characteristics | TiPdAg, Wrap-around | AlTiPdAg, BSR | TiOx | 0.71 | 0.87 |

|  | Isc (mA) | Voc (mV) | Imp (mA) | Vmp (mV) | Pmp (mW) | $V_{Rev}$ −1.1 Isc (V) |
|---|---|---|---|---|---|---|
| Electrical Prop. (AM0, 28° C.) | 3700 | 584 | 3375 | 480 | 1620 | 18–20 |

|  | Isc ($\mu A/cm^2$ ° C.) | Voc (mV/° C.) | Imp ($\mu A/cm^2$ ° C.) | Vmp (mV/° C.) | Pmp (%/° C.) |
|---|---|---|---|---|---|
| EOL Temp. Coefficients (28–60° C.) | +36 | −2.28 | +35 | −2.02 | −0.37 |

|  | Fluence/cm² | Isc | Voc | Imp | Vmp | Pmp |
|---|---|---|---|---|---|---|
| 1 MeV Radiation | 1E14 | 0.94 | 0.965 | 0.935 | 0.96 | 0.90 |
|  | 5E14 | 0.86 | 0.93 | 0.85 | 0.925 | 0.785 |
|  | 2E15 | 0.76 | 0.885 | 0.76 | 0.885 | 0.675 |

As previously discussed, a preferred embodiment baseline SPM design is shown in FIGS. 2 and 3 and consists of six, 10 cm×10 cm, 200 μm BSR silicon solar cells 100 interconnected with 50 μm thick silver-Invar ribbons 206. However, even larger area coverglass sizes may be used. Each SPM 200 is covered with a 100 μm thick, cerium oxide coverglass 202 which is bonded to the cells with Nusil CV7-2500 adhesive 300. Component selection was based on The power density (W/kg) studies were performed to select the coverglass/cell thickness that would provide an optimum W/kg. As shown in FIG. 4, the 0.015 cm/0.010 cm and 0.020 cm/0.010 cm cover and cell design options provide significantly higher values than the other combinations. These two combinations were subsequently evaluated based on manufacturability (yields) and the net cost of producing all of the required SPMs. This analysis. showed that while the 0.015 cm/ 0.010 cm combination had a higher W/kg, it had a higher manufacturing cost due to lower expected yields than the 0.020 cm/0.010 cm combination. Therefore, based on its better $/kg ratio, 0.020 cm/0.010 cm is used in one preferred embodiment. However, other combinations may be used as well. Table 2 below provides an SPM metric in terms of power, mass and area for one particular design.

TABLE 2

A Preferred Embodiment SPM Provides High Power Densities

|  | BOL | EOL |
| --- | --- | --- |
| SPM Power (W) | 9.62 | 5.29 |
| Area (m$^2$) | 0.0609 | 0.0609 |
| Mass (Kg) | 0.05315 | 0.05315 |
| W/Kg | 181 | 100 |
| W/m$^2$ | 158 | 87 |

One preferred embodiment of the WA cell configuration allows for low cost SPM manufacturing. Manufacturing operations may be performed with the solar cells face side down for glassing, interconnecting, testing and marking. This approach reduces handling and greatly increases throughput. Another advantage of the preferred embodiment baselined cell is the interconnect. The interconnect may be a low cost silver-plated Invar ribbon formed for stress relief as part of the automation process and then welded to each cell of the SPM. The silver-plated Invar interconnect material has a thermal coefficient of expansion which is closely matched with silicon. This reduces weld and thermal elongation stresses resulting in a highly reliable, interconnection. The stress relief has been designed to absorb the 0.008 cm movement within the SPM and the 0.051 cm movement between SPMs. In one embodiment, the interconnect is protected from the effects of atomic oxygen by the design of the SPM which shelters the interconnects by covering them with the solar cell, cover adhesive and coverglass. Techniques other than welding may be used to attach the interconnects. By way of example, soldering or crimping techniques may be used as well.

Figure 5:
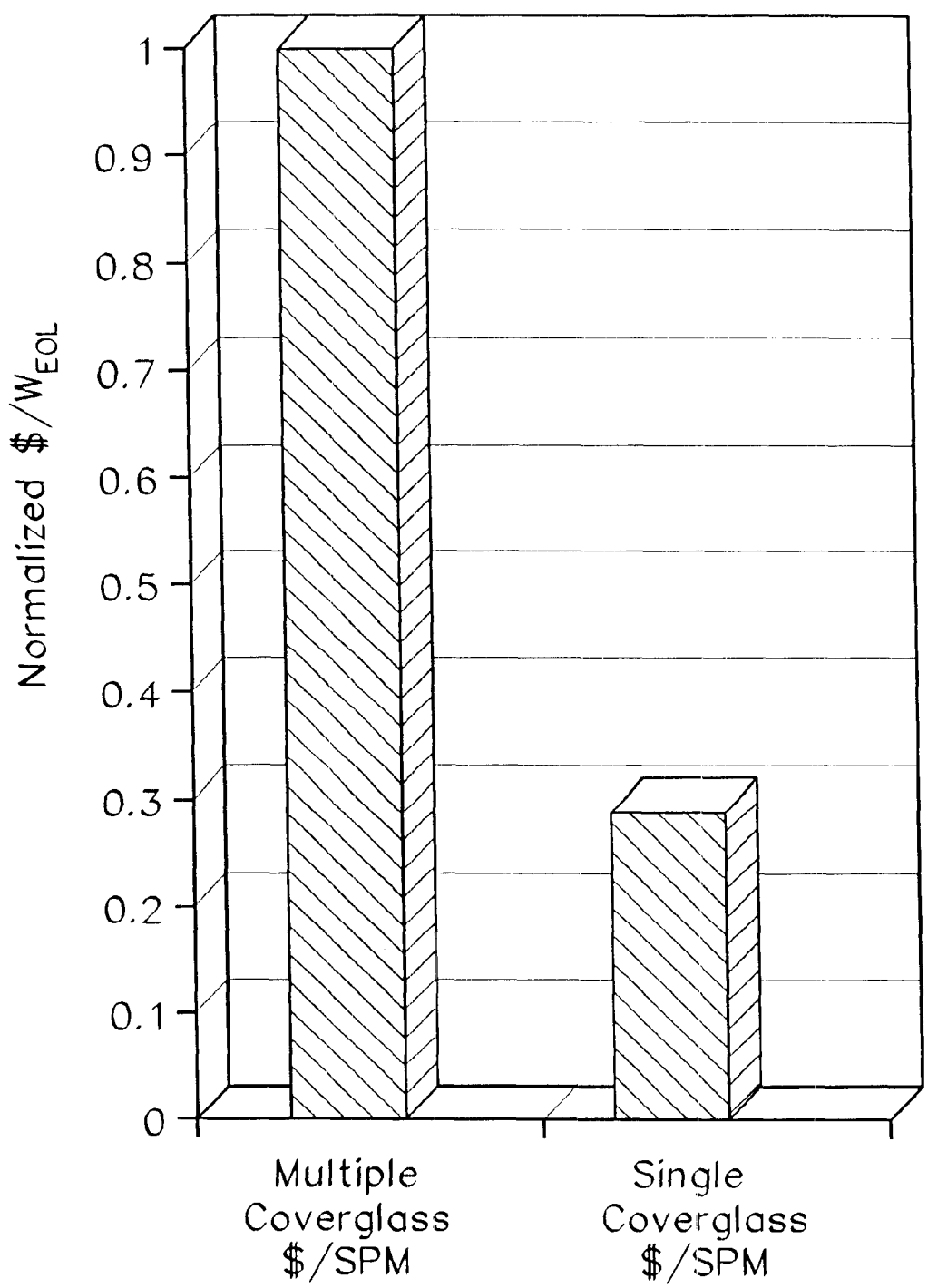
FIG. 5 illustrates the results of a cost versus coverglass quantity tradeoff analysis.
Figure 6:
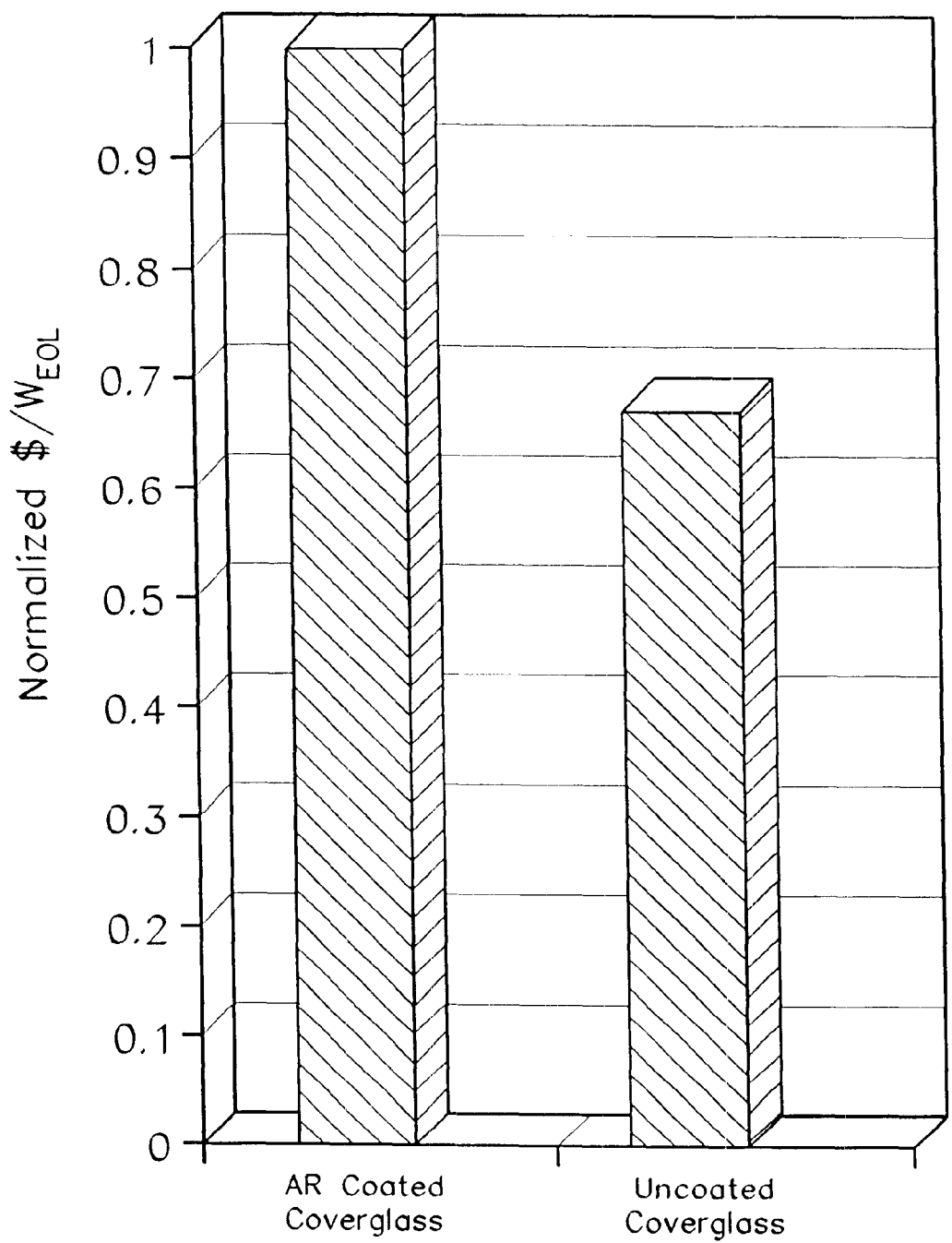
FIG. 6 illustrates the results of a cost versus coverglass coating tradeoff analysis.

The coverglass used in one preferred embodiment was selected by size, thickness and the need for coatings. FIG. 5 depicts the reduced cost savings of more than 71% by processing six cells under one piece of glass as compared to fabricating an assembly of one cell with one piece of glass. However, larger pieces of glass with a greater number of cells are feasible. FIG. 6 provides the results depicting the cost advantage of approximately 35 percent by using uncoated glass versus coated glass expressed in terms of dollars per watt at end-of-life. However, performance enhancements can be gained with the use of antireflective (AR) coatings with possible increased cost and added complexity at processing (having to keep track of the coated side). Coverglass performance experiments have been conducted, and the results show the uncoated coverglass provides a one percent gain as compared to the bare solar cell which is attributable to the improved optical match of the cover overlaid on the cell. It is also possible to use a coverglass that has increased rigidity when treated by a process called. "toughened." The toughened glass process is widely used for military aircraft windshield applications and involves cutting-the coverglass to it's final size, then chemically treating it to replace the sodium ions with potassium ions.

Atomic oxygen erosion of the coverglass will be less than 1 micron when exposed to $1.5 \times 10^{-21}$ A/cm$^2$. By analysis, one can calculate that even a more reactive material such as Teflon, which has a reaction efficiency of $<0.05 \times 10^{-24}$ cm$^3$/atom, would lose approximately 0.75 micron. Using a glass with no antireflection coating, as in one preferred embodiment, ensures that an adverse optical property change will not occur.

Figure 7:
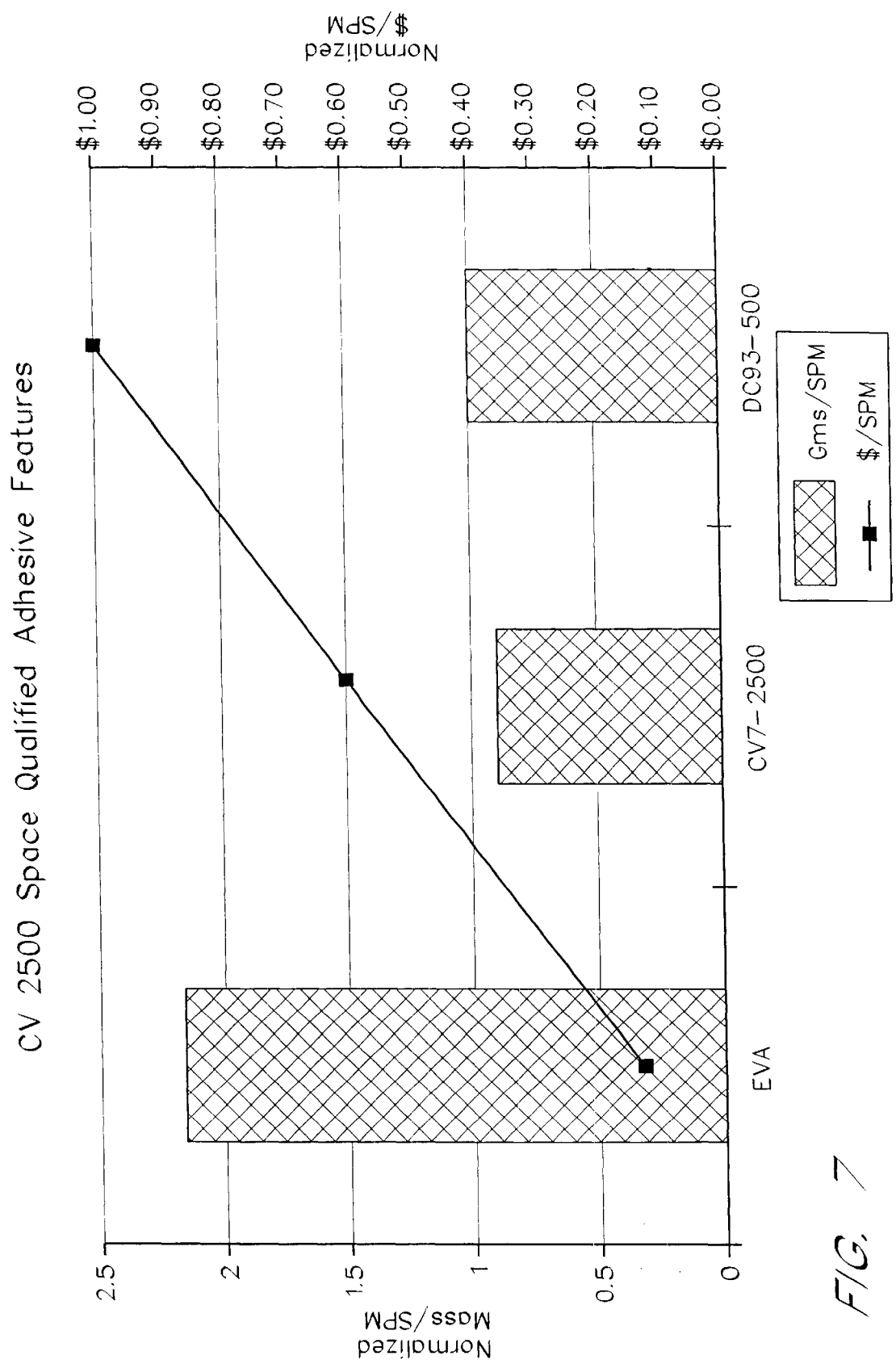
FIG. 7 illustrates the results of a cost versus adhesive mass tradeoff analysis.

FIG. 7 shows that while EVA adhesive represents a significant cost reduction (approximately 5.4. times) over CV7-2500, this growth in cost only affects the overall SPM cost by 2%. However, the mass increase affects the overall SPM by more than 6%. In one preferred embodiment, the lowest mass approach is used. CV7-2500 also has the advantage of being space qualified and meets outgassing requirements where EVA is still in the "experimental" stage for space use. Nonetheless, in another preferred embodiment, EVA may be used as well.

One preferred embodiment of the SPM design facilitates SPM integration into large solar arrays. In a preferred embodiment, silver-plated Invar interconnects protrude from the positive and negative edges of the,SPM to allow for welding of the interconnects between each module. The advantage of this approach is that all SPM level interconnecting is accomplished by overlapping the interconnect tabs and welding or soldering them together. The SPMs are sized and configured to allow for robotic intervention for a convenient pick and place operation.

Figure 10A:
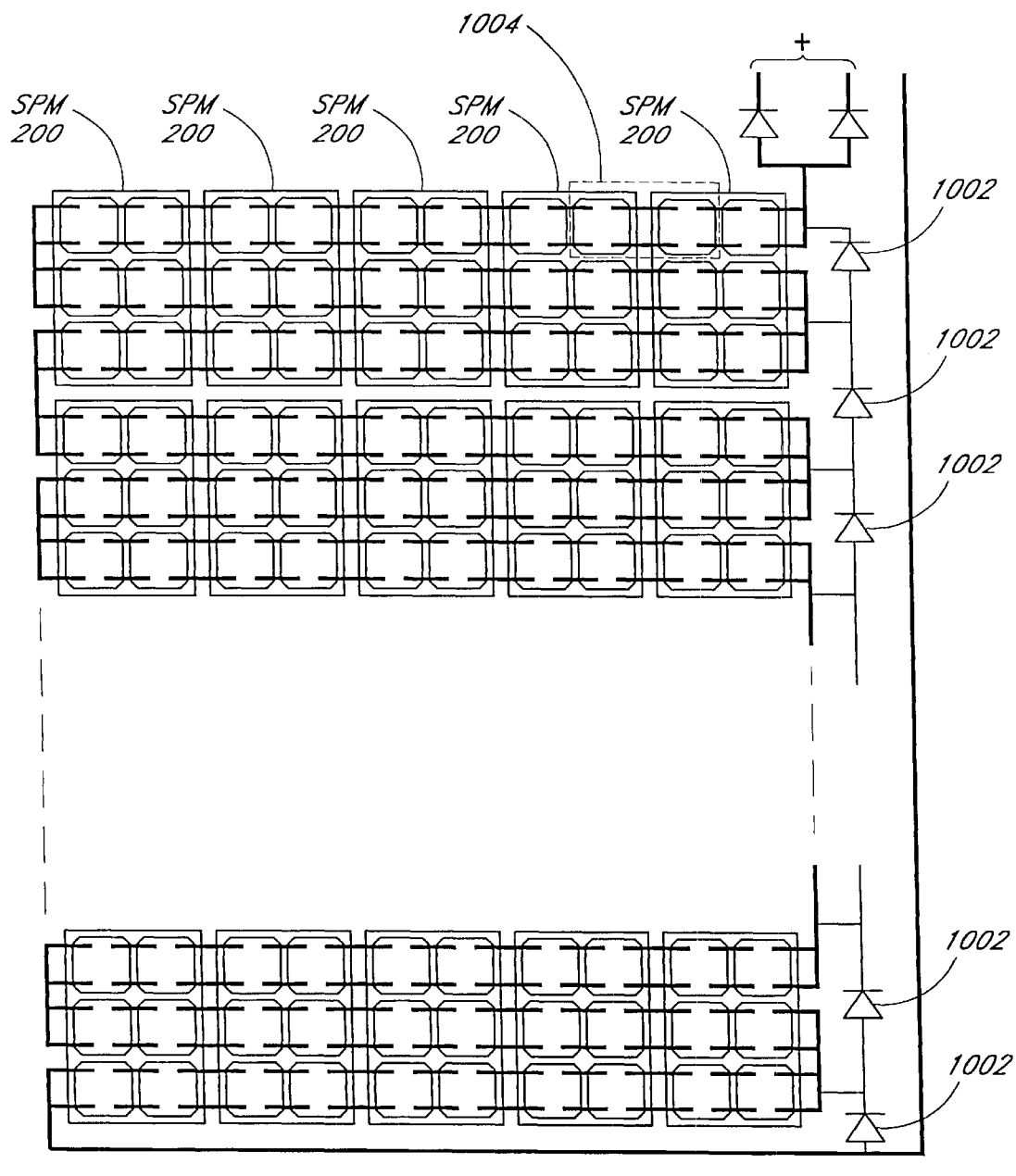
FIG. 10A illustrates one embodiment of an array of interconnected standard power modules.

FIG. 10A illustrates multiple SPMs 200 serially connected into a larger array 1000, thereby providing higher output voltages than are achievable if the SPMs were connected in parallel. The array may optionally be protected using external diodes 1002. In an alternative embodiment, the SPMs may be connected in parallel and the diode may be mounted within the SPMs.

Figure 10B:
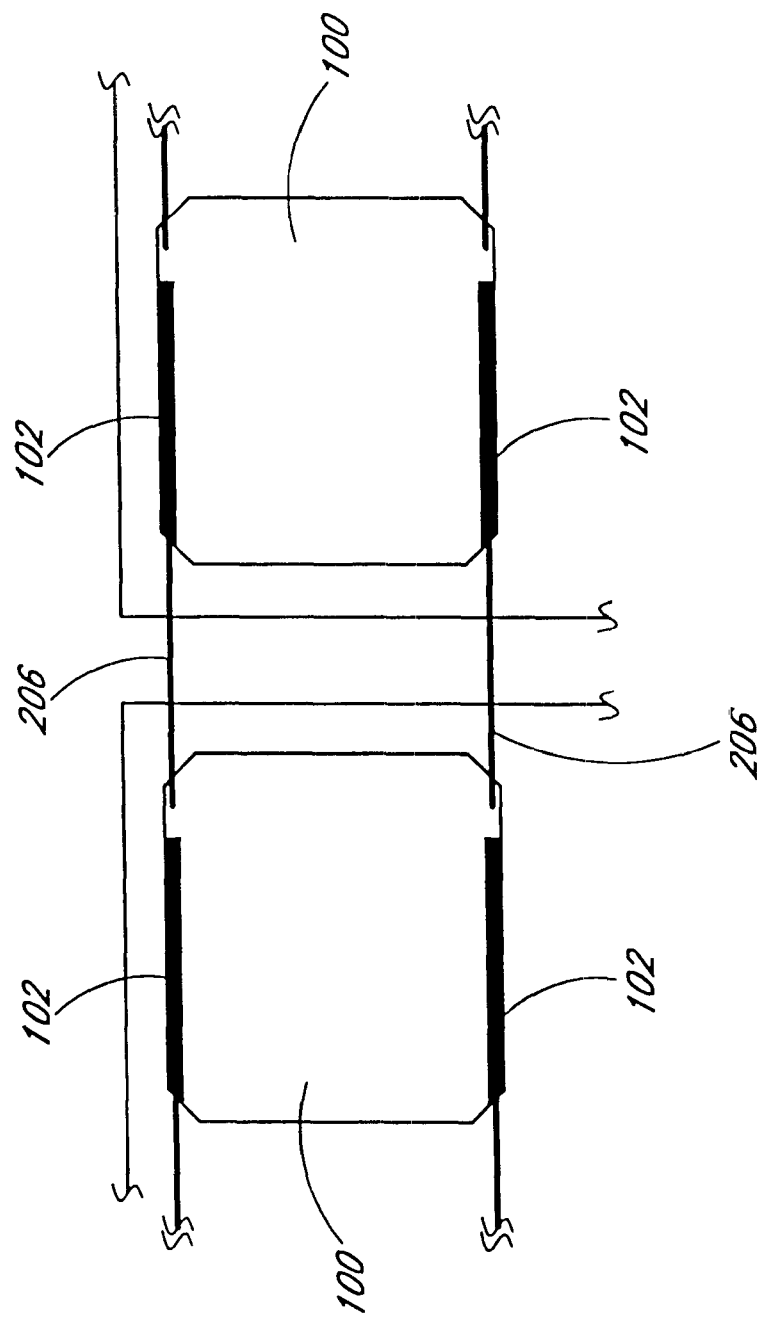
FIG. 10B is a detailed diagram of a portion of the interconnected standard power modules of FIG. 10A.

FIG. 10B is a detailed diagram of a portion 1004 of the interconnected standard power modules of FIG. 10. Interconnects 206 couple the N channel contacts 102 of one cell 100 to the P channel contacts of the adjoining cell.

In one preferred embodiment, silicon solar cells are used because they have the inherent capability to withstand reverse bias voltages experienced when cells in strings are partly or totally shadowed. Many satellites have flown without bypass diode protection, but it is customary to include a bypass diode connected across several silicon cells to prevent overheating or degradation of shadowed cells.

While bypass diodes may not be required, in one preferred embodiment, bypass diode protection is provided at the array level or on the cells themselves. When a bypass diode is mounted on a cell, the diode is typically mounted onto a cell surface. In one embodiment, placing one bypass diode externally for every 20 cells in series (10 SPMs) serves to protect the cells from degradation after the shadow is removed.

In another preferred embodiment, the solar cells are screened to identify and reject cells having reverse bias problems, so that no bypass, diodes are required.

A preferred embodiment of the SPM has excellent on-orbit performance characteristics. Performance predictions indicate that the EOL on-orbit power-to-mass ratio will be 100 W/kg with. an areal power density of 87 W/m$^2$. These levels of performance translate into significant system-level benefits. The array mass savings can be used to increase the payload mass and augment the capacity of the revenue-generating communications systems. The areal power density performance enables a smaller area array, which reduces on-orbit drag, also reducing the fuel (and mass) that needs to be carried for station-keeping.

Power Analysis

A power analysis, presented in Tables 3A and 3B, uses typical loss factors, including Af—the array-level loss factor of 0.938. The $P_{SPM}$ (EOL, on-orbit) and $P_{STC}$ (deliverable configuration) values are highlighted in the analysis, and the Rf, Sf, Af, and Tfn factors are identified. The $P_{STC}$ value is based on SPM operation at the maximum power point. This value may be for acceptance testing and operation at voltages other than the maximum power point. For example, $P_{STC}$ would be 9.064 W (5.80% reduction) if SPM testing is conducted at:

Vtest=0.9*Vmp(STC)=0.855 V.

The cell dimensions are effective dimensions for a rectangular cell having the equivalent area to a preferred embodiment of the cell having cropped corners. A coverglass insertion factor of 1.01 is used. This value results from improved optical coupling to the single-layer AR-coated cell.

The temperature coefficients used are end-of-life values, and are applied in the analysis after all the life factors have been taken. These values were determined from FIGS. 3.15–3.18 of the Jet Propulsion Laboratory (JPL) Solar Cell Radiation Handbook (JPL Publication 82–69). The radiation factors are discussed further below. The UV darkening factor is based on similarity. The operating temperature was determined iteratively.

Radiation Analysis

The following process was used to determine the radiation effects on SPM performance. This method is based on the Solar Cell Radiation Handbook.

Figure 8:
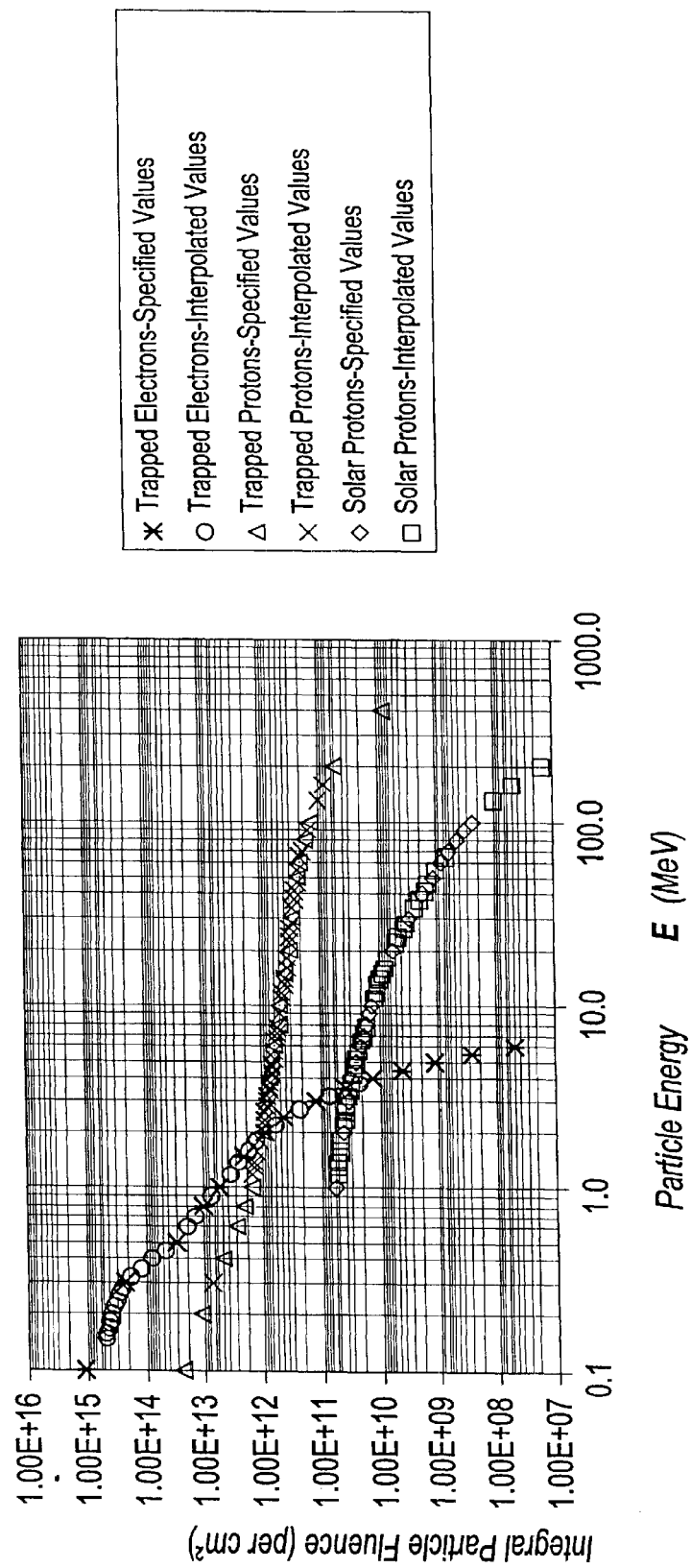
FIG. 8 illustrates the results of a radiation analysis for one relevant operating environment.

Typical energy spectra for charged particle environments were enhanced by interpolating energies for which radiation damage coefficients are defined by JPL. Energy spectra values are shown in FIG. 8 for relevant environments, trapped electrons, trapped protons, and solar protons. This is done to increase the resolution and accuracy of the subsequent calculations for equivalent radiation fluence.

These enhanced spectra were then correlated with the JPL damage coefficients for all values of shielding for which coefficients are defined to determine the equivalent 1 MeV electron fluence. This was done for all relevant environments both for Isc-Voc and Pmax solar cell parameters. The results are presented in FIG. 9. The trapped proton environment is dominant. This data was used for the cell and coverglass thickness trade studies to determine optimum power-to-mass ratio for the preferred embodiment of the SPM design.

TABLE 3A

The SPM Provides 9.62 Watts BOL and 5.29 Watts EOL

| | SOLAR CELL | BSR2 | | | CELL THICKNESS (cm) | | 0.020 | | |
|---|---|---|---|---|---|---|---|---|---|
| | DIMENSIONS | (in)** | 3.900 | 3.900 | COVER THICKNESS (cm) | | 0.010 | | |
| | | (cm)** | 9.906 | 9.906 | AREA (cm2) | | 98.13 | | |

| | CELL PARAMETERS | | | FACTOR | Voc | Isc | Vmp | Imp | Pmax |
|---|---|---|---|---|---|---|---|---|---|
| | BARE CELL | | BSR2 | | 0.584 | 3.70 | 0.480 | 3.38 | 1.62 |
| | SERIES CELLS | | | 2 | 1.168 | | 0.960 | | 3.24 |
| | PARALLEL CELLS | | | 3 | | 11.10 | | 10.13 | 9.72 |
| | ASSEMBLY VOLTAGE | | | 0.990 | 1.156 | | 0.950 | | |
| | ASSEMBLY CURRENT | | | 0.990 | | 10.99 | | 10.02 | 9.53 |
| | COVER GLASS | UNCOATED | | 1.010 | | 11.10 | | 10.12 | 9.62 |
| Pstc | SPM PARAMETERS (Pstc) | | | | | | Efficiency @ 1367 W/m² | | |
| | LAPSS TEST | | BOL @ | 28° C. | 1.156 | 11.10 | 0.950 | 10.12 | 9.62 Eff = 11.95% |
| Af | SPECIFIED ARRAY-LEVEL LOSS | | | 0.938 | 1.120 | 10.75 | 0.920 | 9.81 | 9.03 |
| Sf | SUN INTENSITY (Aphellon) | | | 0.968 | | 10.40 | | 9.49 | 8.73 |
| Rf | MICROMETEORITES | | | 0.995 | | 10.35 | | 9.44 | 8.89 |
| Rf | UV | | | 0.980 | 1.120 | 10.14 | 0.920 | 9.25 | 8.51 |
| Rf | RADIATION EFFECTS | | 1-MeV elect | | | | | | |
| Rf | Voc | EOL | 2.03E+15 | 0.886 | 0.992 | | | | |
| Rf | Isc | EOL | 1.39E+15 | 0.789 | | 8.00 | | | |
| Rf | Vmp | EOL | 2.03E+15 | 0.886 | | | 0.815 | | |
| Rf | Imp | EOL | 1.39E+15 | 0.784 | | | | 7.25 | 5.91 |
| Tfn | TEMPERATURE (DEG C.) | | 56.06 | | | | | | |
| Tfn | EOL TEMP COEFFICIENTS | | | | | | | | |
| Tfn | Voc (mV/C) | | −2.28 | | −0.128 | 0.864 | | | |
| Tfn | Isc (uA/C-cm2) | | 36 | | 0.297 | | 8.30 | | |
| Tfn | Vmp (mV/C) | | −2.02 | | −0.113 | | | 0.702 | |
| Tfn | Imp (uA/C-cm2) | | 35 | | 0.289 | | | | 7.54 |
| | | | | | | | | | 5.29 |
| Pspm | SPM PARAMETERS (Pspm) | | | | | | Efficiency @ 1367 W/m² | | |
| | ON-ORBIT | | EOL @ | 56.06 | 0.864 | 8.30 | 0.702 | 7.54 | 5.29 Eff = 6.58% |

**Effective dimensions due fo corner crops

TABLE 3B

Test Conditions

| | | |
|---|---|---|
| Performance at standard test conditions | $P_{STC}$ | See Table 3A |
| Combined radiation factor | Rf | See Table 3A |
| Efficiency | Eff | See Table 3A |
| Temperature coefficients | Tfn | See Table 3A |
| Front surface absorptance | αf | 0.71 |
| Front surface hemispherical emittance | εf | 0.87 |

The effective shielding was determined for both the front side and back side of the SPM. The values for the baseline design are given in Tables 4 and 5.

TABLE 4

Front Shielding Calculation

| Material | Thickness | Volume Density | Areal Density |
|---|---|---|---|
| Microsheet | 100 μm | 2.605 gm/cm³ | 0.0265 gm/cm² |
| CV7-2500 | 50 μm | 1.01 gm/cm³ | 0.0051 gm/cm² |
| Total | 140 μm of fused silica | | 0.0316 gm/cm² |

TABLE 5

Back Shielding Calculation

| Material | Thickness | Volume Density | Areal Density |
|---|---|---|---|
| Silicon Array | 150 μm* | 2.33 gm/cm³ | 0.0355 gm/cm² |
| | | | 0.0290 gm/cm² |
| Total | 290 μm of fused silica | | 0.0645 gm/cm² |

*The 200 μm physical cell thickness equates to 150 μm shielding thickness because of reduced red and infrared response in the cell base.

Figure 9:
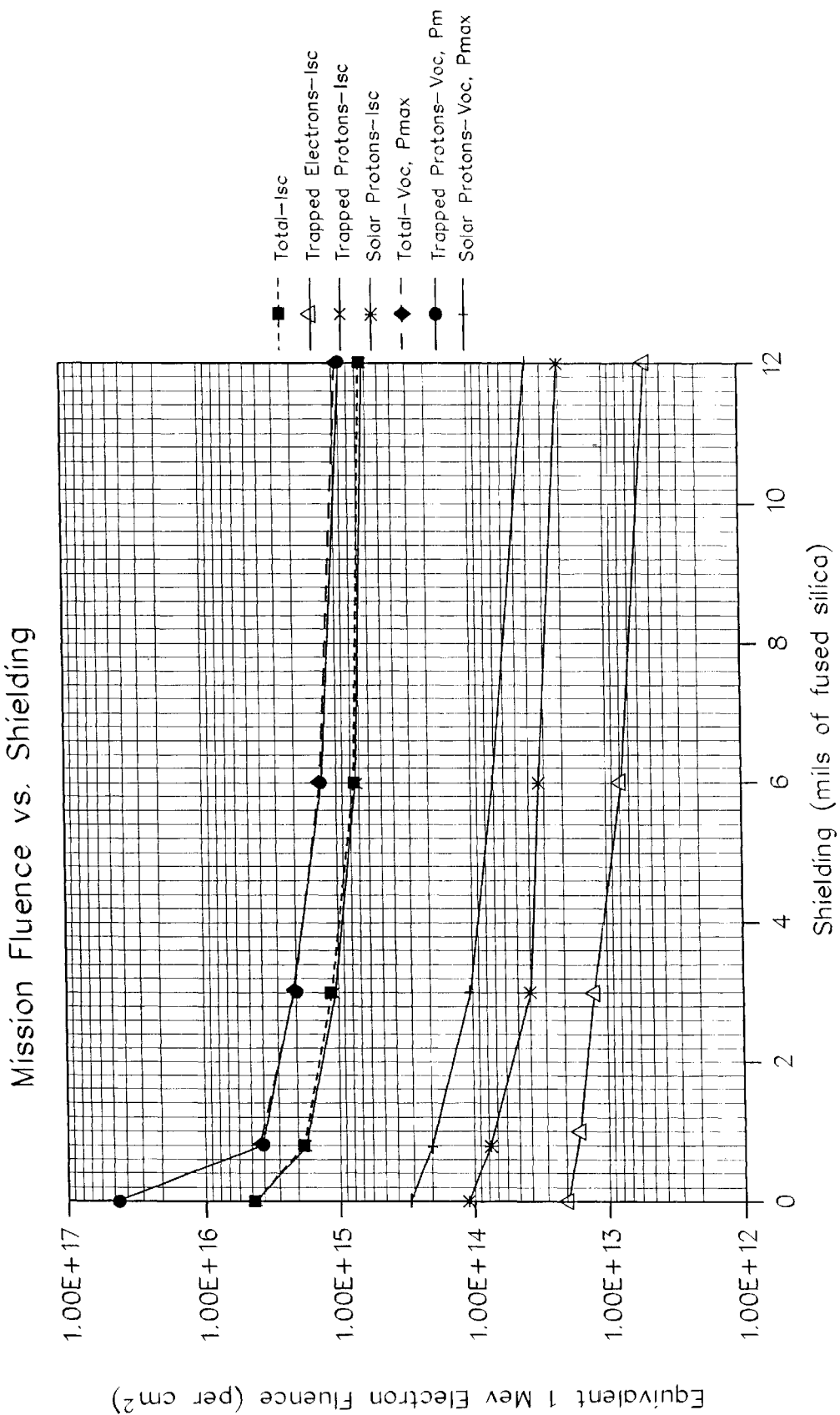
FIG. 9 is a graph illustrating mission fluence versus shielding.

The total mission fluence is established from the front and back shielding values given in Tables 4 and 5, respectively, and in FIG. 9. The results are shown in Table 6 below. It is noted that the Isc curve is used for all solar cell parameters for the back shielding case, consistent with the treatment of Table 6.1 of the Solar Cell Radiation Handbook. The degradation factors used in the power analysis are then taken from Figures 3.55 to 3.59 of the Solar Cell Radiation Handbook.

TABLE 6

Total Mission Fluence

| | Isc | Voc, Pmax |
|---|---|---|
| Front | 8.20E+14 | 1.46E+15 |
| Back | 5.66E+14 | 5.66E+14 |
| Total | 1.39E+15 | 2.03E+15 |

A mass analysis for the SPM is shown in Table 7 below. Results of mass measurements for prototype coverglass and silicon wafers, the dominant components of the SPM, were used to validate the calculated values.

TABLE 7

Mass Analysis

| SPM Components | Thickness (μm) | Area (cm²) | Unit Mass (gm) | Quantity per SPM | Total Mass (gm) | % of Total Mass |
|---|---|---|---|---|---|---|
| Silicon Solar Cell | 200 | 98.131 | 5.20 | 6 | 31.20 | 58.7 |
| Solder | | | N/A (welded) | | | |
| Coverglass | 100 | 609.868 | 16.141 | 1 | 16.14 | 30.4 |
| Coverglass Bonding Adhesive (CV7-2500) | 50 | 98.131 | 0.503 | 6 | 3.02 | 5.70 |
| Interconnects | | | 0.155 | 18 | 2.79 | 5.20 |
| Total | | | | | 53.15 | 100.00 |

The calculated reliability, $R_{SPM}$, of the SPM is equal to the calculated probability of success. The probability of success is related to component and weld joint failures. The solar cell failure rate, λ, is, expressed in units of "number of failures per operating hour." The failure rate of $1 \times 10^{-9}$ failures per solar cell operating hour was used based on the JPL solar cell array design handbook.

A mission life of ten years and the on-orbit temperature of 56° C. were used to determine the failure rate. The reliability predictions were calculated for three scenarios: 1) two cells in series; 2) six cell in series; and, 3) two cells in series and three in parallel.

The solar cell failure rate of $1 \times 10^{-9}$ failures/hour is valid at 30° C. The on-orbit temperature was calculated to be 56° C. (see SPM performance for details). The failure rate increases by 5% per 10° C. increase in temperature.

56° C.−30° C.=26° C.

26° C.×0.005=0.13

λ cell=$(1 \times 10^{-9}) \times 1.13 = 1.13 \times 10^{-9}$ @ 56° C.

$R_{SPM} = [e^{(-\text{number of cells in series} \times \lambda \text{ cell} \times \text{mission life in hours})}]^x$ where x=number of cells in parallel and where Mission Life=10 years×365 days/year×24 hours/day=87,600 hrs.

Scenario 1, 2 Cells in Series $R_{SPM} = [e^{(-2 \times 1.13 \times 10^{-9} \times 87,600)}]$ $R_{SPM} = 0.9998$ Scenario 2, 6 Cells in Series $$R_{SPM}=[e^{(-6\times 1.13\times 10-9\times 87,600)}]$$

$$R_{SPM}=0.9994$$

Scenario 3, 2 Cells in Series by 3 in Parallel $$R_{SPM}=[e^{(-2\times 1.13\times 10-9\times 87,600)}]^3$$

$$R_{SPM}=0.9994$$

In summary, in at least one preferred embodiment, the SPM design is highly reliable.

Cell Manufacture and Test

Figure 11:
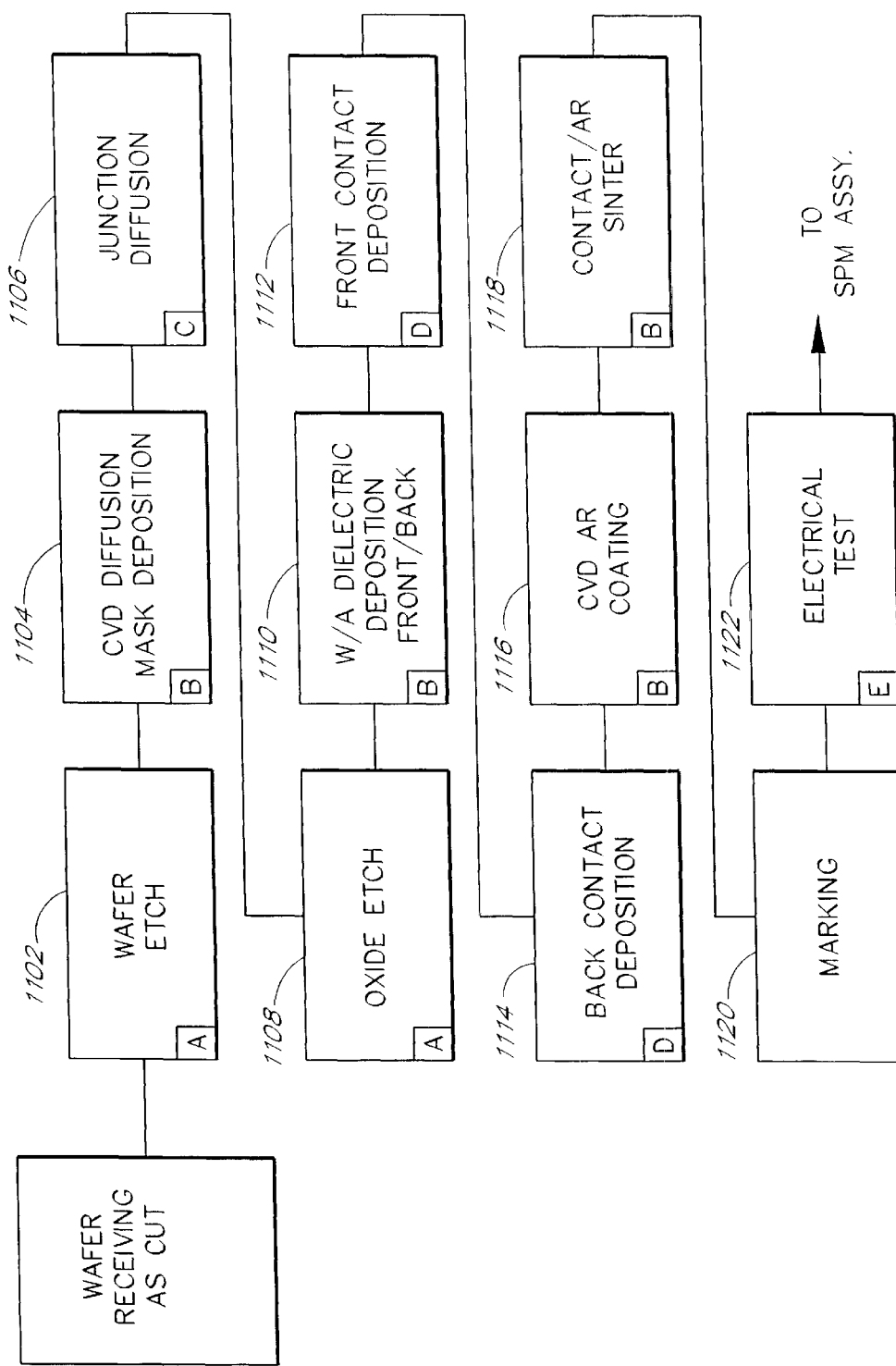
FIG. 11 illustrates one embodiment of a solar cell manufacturing process.

One example of a general solar cell manufacturing process is illustrated in FIG. 11. It is understood that other processes may be used as well.

(1) Wafer Etching 1102

In one preferred embodiment, wafers used in the SPM may be wire sawed. The wafers then undergo surface preparation. After sample inspection to verify compliance with size, thickness, resistivity, surface quality and cleanliness, the wafers are chemically etched to remove surface contaminants and damage from the sawing process. The wafers may be acid etched using automated production equipment to prepare the surface and control wafer thickness. The front surface is preferably smooth and free of work damage and provides for a shallow (0.15 $\mu$m) N+/P junction with good characteristics. In a preferred embodiment, the back surface polish provides high reflectance for longer wavelengths, reducing solar absorptance giving lower on-orbit cell temperature. For the wraparound (WA) design, this etch method provides a well rounded edge for proper deposition of insulating layers and contact materials. Automated handling from coin-stacked wafers to Teflon boats may be used. The transfer ensures that the two WA edges are etched and returned to a cassette, with all edges correctly aligned. The post-etch wafer thickness is controlled using SPC procedures which measure and control thickness by etchant temperature, concentration and immersion time.

Preferably, the manufacturing equipment. provides automation which allows for cassette-to-cassette wafer processing to achieve high throughput and yields.

(2) CVD $SiO_2$ Deposition 1104

In one embodiment, a diffusion mask is used on the back surface of the wafer prior to N+ diffusion to prevent doping of the back side of the wafer during the diffusion process, providing uniform and repeatable $SiO_x$ layers. An ellipsometer is used to measure the oxide thickness and the process is controlled by using SPC methods.

The CVD production equipment is. available from Watkins-Johnson, and uses a continuous belt process with automatic cassette-to-cassette loaders. The wafers are transported through the furnace on a belt where silane and oxygen are mixed to form $SiO_2$ on the heated back surface of the wafers. The loaders allow for high throughput and high yields.

(3) The Diffusion Process 1106

Diffusion is the primary technique for forming the shallow N+/P junction. The wafers are semi-automatically transferred from polypropylene cassettes into a quartz diffusion boat. A transfer, device is used to transfer. the wafers to minimize wafer chipping and breakage and to maintain the alignment of the designated WA edges. The solar cell junction is formed in clean quartz boats and tubes. Phosphorus oxichloride ($POCl_3$) and oxygen are used to form phosphorus pentoxide ($P_2O_5$) on the surface of the wafers. The high temperature ($\approx$850° C.) drives the phosphorus into the wafer to form the junction. The sheet resistance of the diffused layer is controlled using SPC methods. This control ensures proper junction depth and therefore the good cell performance, both before and after orbital irradiation.

The MRL production rate diffusion furnace uses advanced process control capability to control diffusion depths and sheet resistance values. Quartz boats are manually loaded on a quartz paddle to start the process. The computer control system automatically positions the wafers in the hot zone of the furnace, initiates the proper gas flow sequence, and slowly transfers the wafers out of the process tube to cool. The wafers are then transferred back to polypropylene boats.

(4) Oxide Etch Process 1108

This process removes the oxide formed during the diffusion mask process (CVD) and removes the thin glassy oxides formed during the diffusion process. The etching solution uses a mixture of hydrofluoric acid and deionized water.

The oxide etch process is totally automatic and uses the same equipment type as for acid etch. Wafers are staged at the front of the machine in cassettes. The machine picks up the cassettes and automatically processes them through the etch and rinse. steps. It also automatically loads and replenishes, the chemicals using a chemical dispense system.

(5) CVD $SiO_2$ for Dielectric 1110

A dielectric oxide is preferably formed on the edges of the wafers, where the WA metal is deposited, to prevent shorting of the P/N junction. The dielectric is formed in the WA areas using CVD $SiO_2$. Mechanical masks are used to define the pattern for isolation of the N-contact on the front and back sides of the wafers. The oxide thickness is controlled using SPC criteria.

The Watkins-Johnson machine is the same type as used for CVD of $SiO_2$ for the diffusion mask process. It is a reliable, continuous belt process. The operator positions a mask properly on a wafer, and clamps it with a clip. The wafer and mask assemblies are manually placed on the belt of the CVD $SiO_2$ furnace, and $SiO_2$ is deposited in the designated WA areas.

(6) Front/Back Metal Evaporation 1112, 1114

Front (TiPdAg) and back (AlTiPdAg) metal contact depositions are performed in high volume vacuum deposition evaporators used extensively for space cell manufacturing. CHA Industries Mark 50 vacuum deposition system is specifically designed for flexibility and long term reliability to support high volume production. Precision metal masks, with $\approx$50 $\mu$m wide grid openings, are used to form the front grid and bus bar pattern. The mask maintains cell performance while eliminating the usual expensive, labor intensive photolithography processing. A mask is also used for the back side to ensure the proper electrical isolation needed on the back side between the P and N metal contacts. The metal thickness are controlled using SPC methods.

(7) Antireflective (A/R) Coating Process 1116

The cells are coated with an atmospheric pressure chemical vapor deposited (CVD) antireflective coating on the front surface. The coating operation is a low cost, high volume, continuous belt process using equipment provided by BTU International. Vaporized tetraisopropyltitanate (TPT) and water are mixed and introduced to the heated a surface of the wafers where $TiO_2$ is formed. With the WA cell design, masks are not required to shield the contacting areas from the AR coating for additional cost reduction.

(8) Sintering Process 1118

Contact and coating sintering is performed to form good ohmic contact to the cell and to increase adhesion to the silicon wafer. The AR coating adhesion is also improved. Sintering uses a belt furnace supplied by the Thermco Company. Hydrogen and nitrogen are mixed in the furnace to minimize oxidation of the metals during the process. The wafers are placed directly on the moving belt, and process controllers ensure that the correct heating rate, dwell time and cooling rate are maintained for optimum contact sintering. The wafers are then removed from the belt and placed in coin stacks.

(9) Cell Lot # Marking 11120

Traceability of each evaporation lot is established using a TECSTAR standard high volume, non-contact VideoJet marking system. Other marking systems may also be used.

(10) Cell Electrical Test 11122

Solar cells are tested with automated cell test equipment incorporating an integrated AM0 solar simulators. The cells are separated into electrical groups based on their individual outputs measured at a constant test voltage.

Coin stacks of cells are placed in a load stacker magazine on the tester. A robotic transfer system automatically places the cells under the solar simulator for testing, and then places the cells in the proper electrical group. The operator only needs to pick up the counted stacks of tested cells and to identify electrical groups. The sorted cells are transferred to the assembly area for assembly into SPMs.

SPM Manufacture and Test

Figure 12B:
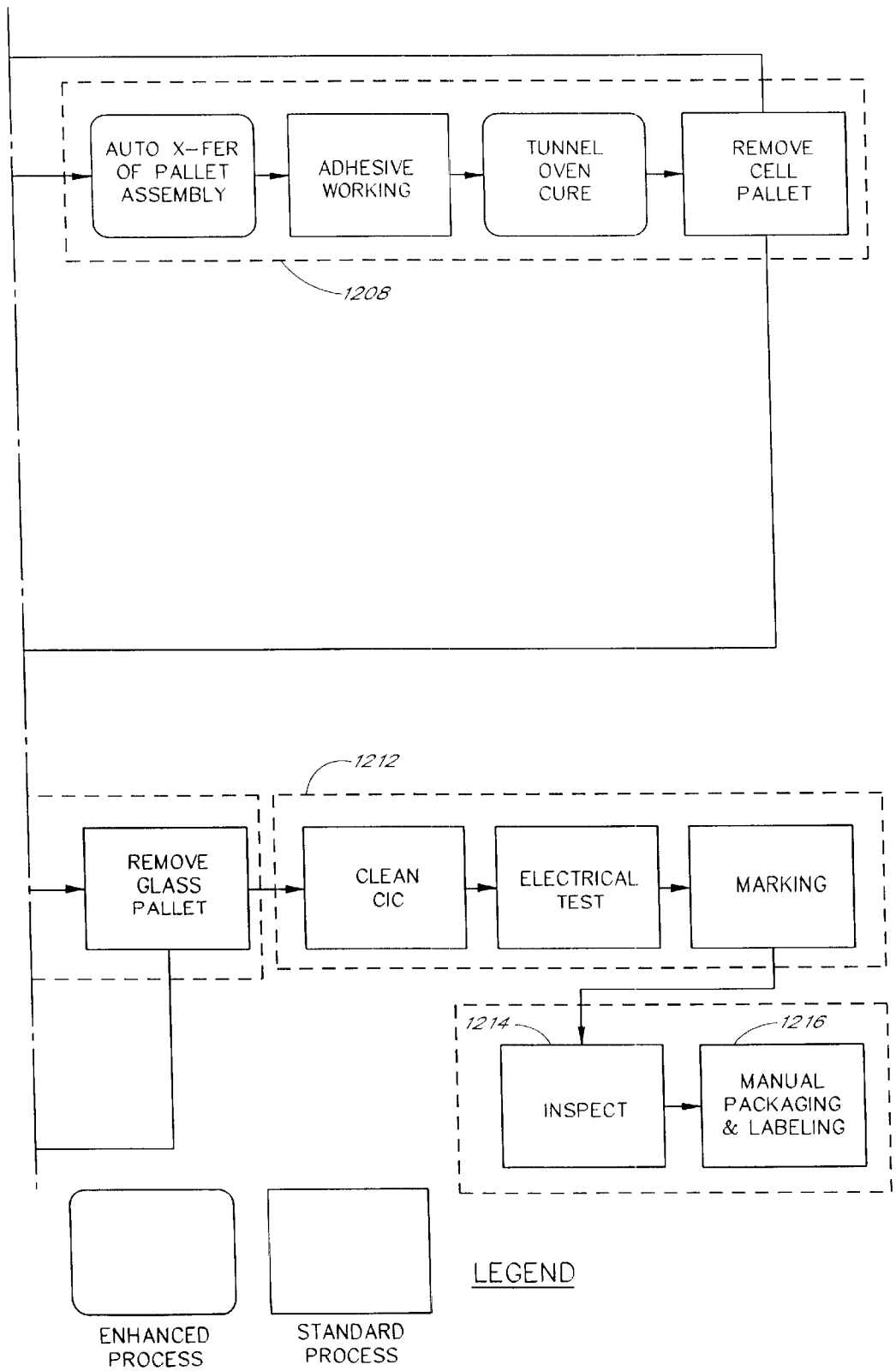
FIGS. 12A, B illustrate one embodiment of a standard power module manufacturing flow.

One technique for manufacturing SPMs is illustrated in the SPM Manufacturing Flow diagram of FIG. 12. It will be understood by one skilled in the art that other known techniques may be used as well. The detailed descriptions of the individual SPM processing, steps are contained in the following paragraphs.

(1) Load Cell Pallet 1202

An automated cell handling system is used to provide the accuracy and repeatability needed for high volume assembly.

Cells may be robotically removed from a cassette and positioned on a six-cell fixture (cell pallet) that maintains the cell alignment throughout the glassing process. Only minimal mechanical contact with the active surface of the cell occurs. Contact of the cells edges and the active surfaces with metal surfaces is eliminated. Unlike a standard front-to-back contact cell, no handling steps involving awkward "tabbed" cells are required.

The positioning and adhering of the cell onto a cell pallet removes possible inherent cell bow in addition to maintaining the cell's location with respect to the other five cells. Varying cell gaps due to cell dimensional tolerances become less critical when interconnects do not pass through them. Having no interconnects on the cell back enables the cells to be placed flat against the pallet for precise control of the adhesive and SPM assembly thickness.

The automated rotation (180° flip) of the loaded cell pallet, followed by the cell's self-aligning placement onto a glass pallet containing a coverglass with glassing adhesive, completes this process step.

(2) Load Glass Pallet 1204

Manual removal of coverglass from its shipping container provides a dependable and expedient method of separation from the protective packing materials. Next, a cleaning process (nitrogen blow-off) and visual inspection provides screening for potential material defects. The six-cell coverglass is then aligned onto a glass pallet designed to retain its position and protect the glass edges from subsequent damage. The pallet is also designed to reduce or eliminate material "bowing" throughout the glassing process. Maintaining the cells and the coverglass flat to the fixture surfaces is helpful in controlling the adhesive gap during the "wicking" and adhesive cure processes. The transfer and alignment of the pallet onto the adhesive deposit station completes this process step.

(3) Adhesive Deposit On Glass 1206

Manual adhesive preparation, documentation and equipment calibration have been proven effective for high-volume production. Standard procedures emphasize attention to material pot life and storage conditions. Adhesive materials are packaged in precise mix ratios for accuracy. Prior to dispensing, the adhesive mix is "de-gassed" in a vacuum chamber to remove entrapped air and minimize voids during glassing.

An adhesive pattern is deposited onto the coverglass surface with the precision control of a programmed X-Y table in concert with. a multi-head adhesive metering system for consistent placement and repeatable volume dispensing. Transfer of the glass pallet containing a coverglass with glassing adhesive completes this process step.

(4) Adhesive Cure 1208

The cell/adhesive/glass sandwich is automatically transferred to a conveyor where adhesive "wicking" progresses under ambient conditions under the weight of the cell pallet. The cell pallet remains aligned with the glass pallet via guide pins which allow the sandwich to come together until the cell pallet bottoms-out on the glass pallet and the adhesive gap is fixed. Even with adhesive viscosity changes over the allowable pot life of the material, full wicking is achieved in the time allotted. Any excess adhesive flows into the gaps between the cells. Without any interconnects attached to the cell's active side, the adhesive gap design is the thinnest and produces the lightest overall weight. The option of glassing with EVA produces an excessive 0.013 cm cell/coverglass gap due to sheet material thickness limitations, so selected liquid silicones with thickness capabilities down to 0.003 cm are preferable. Since interconnects in this area would inhibit and complicate adhesive flow, trap unwanted air and promote cell surface high-spots that may come in contact with the glass, alternatives to the WA cell design are less desirable during this process.

At the end of the wicking operation, the fixture assembly passes through a tunnel oven profiled to bring each fixture up to temperature gradually, to thus prevent warping of the assembly or uneven cure of the adhesive. The conveyor belt width is oversized to allow a large range of adjustment without limiting throughput. The end of the conveyor passes through a cooling section designed to bring the assembly back to ambient conditions without stressing the SPM. The conveyor system ensures that each SPM is exposed to identical process parameters unlike a batch oven system that is subject to the human variable. To end this process step, the cell pallet is removed from the assembly, leaving the glass pallet containing the module to be manually transferred to the interconnecting station.

(5) Interconnect And Inspect 1210

Automated interconnection technology is used to mechanically form individual interconnects from a reel of ribbon and then robotically position them for welding. Redundant welding performed with state-of-the-art "constant power" controlled equipment ensures superior reliability and weld strength consistency by automatically adjusting to variances in cell/interconnect surface conditions via process feedback. All portions of the interconnect, including the formed strain relief and welded areas, are fully exposed and free from adhesive contamination unlike any of the front to back contact options. When contact must be made to the front side of a cell, the interconnects strain relief and weld joints become buried in adhesive during the glassing process, prompting concern with having to endure differential thermal stresses between the front and back-side of the cell. By contrast, welding solely to the cell back-side after glassing, in accordance with one embodiment of the present invention, creates intimate support of every portion of the cell with an adhesive/glass layer producing the lowest mechanical stresses. Welding to a cell's front side typically requires a pre-glassing weld station, and special handling of interconnected cells, causing increased attrition and manufacturing difficulties. A weld station also attaches the necessary array interconnects to the SPM as detailed above. After welding, an integrated visual inspection identifies candidates to be separated for rework on another weld station to prevent any interruption in product flow. The SPM is then separated from the glassing pallet and transferred to the cleaning station.

(6) Clean, Electrical Test And Mark 1212

Manual cleaning of SPM coverglass utilizing process compatible solvents to remove adhesive contamination is performed as required. Unlike soldered interconnects, welding leaves no contaminating residue. Additionally, the process used for attaching interconnects after glassing eliminates clean-up which would otherwise be necessary due to adhesive wicking along the interconnect into its strain relief region. The next step is to position the SPM glass-side down on the electrical test fixture. Automated probing of the electrical contacts, flash testing, data collection/storage and marking of the SPM with bar-code and human readable codes are completed at this station to guarantee traceability and minimize further handling steps prior to the inspection process.

(7) Inspection 1214

Visual in-process inspection is performed by line operators. Final inspection of the SPM may be independently performed by quality assurance personnel in accordance with an approved Acceptance Test Plan.

(8) Packaging 1216

Completed SPMs are packaged in reusable containers designed for mechanized loading/unloading.

While certain preferred embodiments of the invention have been described, these embodiments have been presented by way of example only, and are not intended to limit the scope of the present invention. Accordingly, the breadth and scope of the present invention should be defined only in accordance with the following claims and their equivalents.

What is claimed is:

1. A solar cell array module suitable for use in space, said solar cell array module comprising:
   at least two interconnected solar cells, each of said at least two interconnected solar cells having a space radiation tolerant semiconductor structure;
   a substantially transparent cover overlaying at least a portion of each of said at least two interconnected solar cells, said cover adapted for protecting each of said at least two interconnected solar cells against damage when exposed to a substantially Air-Mass-Zero (AM0) space environment, said cover remaining substantially transparent when exposed to a substantially AM0 space radiation environment;
   a first contact located on a back of a first of said at least two interconnected solar cells;
   a second contact located on a back of a second of said at least two interconnected solar cells;
   a first interconnect coupled to said first contact for interconnection to at least a second solar cell array module; and
   a second interconnect coupled to said second contact for interconnection to at least a third solar cell array module.

2. The solar cell array module as defined in claim 1, further comprising at least one two-sided wraparound contact which wraps from a front side to a back side of at least one of said interconnected solar cells.

3. The solar cell array module as defined in claim 2, wherein said wraparound contact occupies less than 5% of said back side of said interconnected solar cell.

4. The solar cell array module as defined in claim 1, wherein at least one of said interconnected solar cells is no greater than 200 μm thick.

5. The solar cell array module as defined in claim 1, further comprising at least one bypass diode coupled to at least one of said solar cells.

6. The solar cell array module as defined in claim 1, wherein at least one of said two solar cells has an efficiency of greater than 12%.

7. The solar cell array module as defined in claim 1, wherein at least one of said two solar cells has an efficiency of greater than 24%.

8. The solar cell array module as defined in claim 1, wherein at least one of said two solar cells has an area of at least 100 cm$^2$.

9. The solar cell array module as defined in claim 1, wherein said at least two solar cells are connected in series.

10. The solar cell array module as defined in claim 1, wherein said at least two solar cells are connected in parallel.

11. The solar cell array module as defined in claim 1, wherein said cover is at least 600 cm$^2$.

12. The solar cell array module as defined in claim 1, said solar cell array module having a power-to-mass ratio of at least 100 W/kg.

13. The solar cell array module as defined in claim 1, said solar cell array module having an areal power density of at least 87 W/m$^2$.

14. The solar cell array module as defined in claim 1, wherein said AM0 radiation tolerant semiconductor structure includes at least a radiation resistant, shallow junction N on P structure.

15. The solar cell array module as defined in claim 1, further comprising:
   a first polarity of a first of said at least two solar cells;
   a second polarity of said first of said at least two solar cells;
   a first contact coupled to said first polarity; and
   a second contact coupled to said second polarity.

16. The solar cell array module as defined in claim 15, wherein said first contact and said second contact are mounted on a same side of said first solar cell.

17. The solar cell array module as defined in claim 15, wherein said first contact is mounted on a first side of said first solar cell and said second contact is mounted on a second side of said first solar cell.

18. A solar cell assembly for use in a space environment, said solar cell assembly comprising:
   a first module comprising:
       a first solar cell;
       a second solar cell interconnected to said first solar cell;
       a first substantially transparent cover overlaying at least a portion of each of said first and second solar cells, said first cover adapted for protecting said first solar cell and said second solar cell against damage in an Air-Mass-Zero (AM0) space environment, said first cover remaining substantially transparent when exposed to an AM0 space radiation environment;

a second module comprising:
  a third solar cell;
  a fourth solar cell interconnected to said third solar cell;
  a second substantially transparent cover overlaying at least a portion of each of said third and fourth solar cells, said second cover adapted for protecting said third solar cell and said fourth solar cell against damage in an AM0 space environment, said second cover remaining substantially transparent when exposed to an AM0 space radiation environment; and
  a first interconnect coupled to at least one of said first and second solar cells and at least one of said third and fourth solar cells for interconnecting said first and second modules.

19. The solar cell assembly as defined in claim 18, wherein at least one of said first, second, third and fourth solar cells includes a radiation resistant, shallow junction N on P structure.

20. The solar cell assembly as defined in claim 18, further comprising at least a first contact and a second contact, both of said contacts overlaying at least a portion of a back side of one of said first, second, third, and fourth solar cells, wherein said first contact is coupled to a first solar cell polarity and said second contact is coupled to a second solar cell polarity.

21. An Air-Mass-Zero (AM0) radiation tolerant solar cell array module which is assembled into a larger solar panel to generate power for a spacecraft, said AM0 radiation tolerant solar cell array module comprising:
  at least a first solar cell having a first back side and a first front side and a second solar cell having a second front side and a second back side, wherein said first solar cell is a discrete component and said second solar cell is a discrete component;
  a first contact formed on at least the first back side of said first solar cell;
  a second contact formed on at least the second back side of said second solar cell;
  a conductor in electrical communication with said first contact and said second contact;
  a third contact coupled to said first solar cell, said third contact couplable to another AM0 radiation tolerant solar cell array module; and
  a cover overlaying at least a portion of each of said first solar cell and said second solar cell, said cover configured to protect said first solar cell and said second solar cell against damage in an AM0 space environment and to allow light to pass through the cover to reach at least said portion of each of said first solar cell and said second solar cell.

* * * * *